(12) United States Patent
Lin et al.

(10) Patent No.: US 8,212,292 B2
(45) Date of Patent: Jul. 3, 2012

(54) HIGH GAIN TUNABLE BIPOLAR TRANSISTOR

(75) Inventors: Xin Lin, Phoenix, AZ (US); Daniel J. Blomberg, Chandler, AZ (US); Jiang-Kia Zuo, Chandler, AZ (US)

(73) Assignee: Freescale Semiconductor, Inc., Austin, TX (US)

(*) Notice: Subject to any disclaimer, the term of this patent is extended or adjusted under 35 U.S.C. 154(b) by 85 days.

(21) Appl. No.: 12/622,625

(22) Filed: Nov. 20, 2009

(65) Prior Publication Data

US 2011/0121428 A1 May 26, 2011

(51) Int. Cl.
*H01L 31/0328* (2006.01)
(52) U.S. Cl. ........ 257/197; 257/163; 257/565; 257/577; 257/578; 257/579; 257/591; 257/E27.015
(58) Field of Classification Search .................. 257/163, 257/197, 565, 577, 578, 579, 591
See application file for complete search history.

(56) References Cited

U.S. PATENT DOCUMENTS

| 5,548,158 | A | | 8/1996 | Bulucea et al. |
| 5,589,409 | A | | 12/1996 | Bulucea et al. |
| 5,793,085 | A | | 8/1998 | Vajana et al. |
| 6,060,763 | A | * | 5/2000 | Yamagishi et al. ........... 257/577 |
| 2003/0160302 | A1 | * | 8/2003 | Sankin et al. .................. 257/565 |
| 2005/0189564 | A1 | * | 9/2005 | Jensen et al. .................. 257/197 |
| 2007/0222032 | A1 | * | 9/2007 | Schaefer et al. .............. 257/565 |

* cited by examiner

*Primary Examiner* — Wai Sing Louie
(74) *Attorney, Agent, or Firm* — Sherry W. Schumm

(57) ABSTRACT

An improved bipolar transistor (40, 40') is provided, manufacturable by a CMOS IC process without added steps. The improved transistor (40, 40') comprises an emitter (48) having first (482) and second (484) portions of different depths (4821, 4841), a base (46) underlying the emitter (48) having a central portion (462) of a first base width (4623) underlying the first portion (482) of the emitter (48), a peripheral portion (464) having a second base width (4643) larger than the first base width (4623) partly underlying the second portion (484) of the emitter (48), and a transition zone (466) of a third base width (4644) and lateral extent (4661) lying laterally between the first (462) and second (464) portions of the base (46), and a collector (44) underlying the base (46). The gain of the transistor (40, 40') is much larger than a conventional bipolar transistor (20) made using the same CMOS process. By adjusting the lateral extent (4661) of the transition zone (466), the properties of the improved transistor (40, 40') can be tailored to suit different applications without modifying the underlying CMOS IC process.

16 Claims, 7 Drawing Sheets

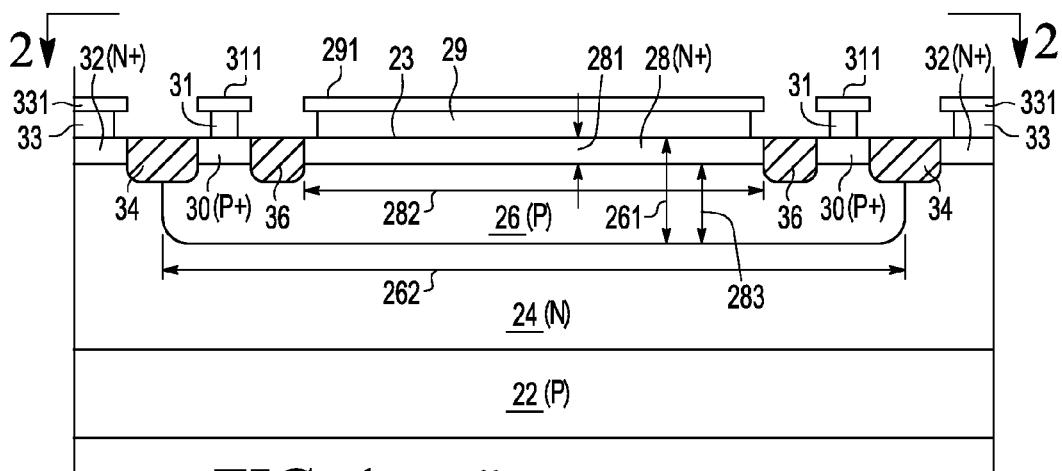
FIG. 1   20   - PRIOR ART -
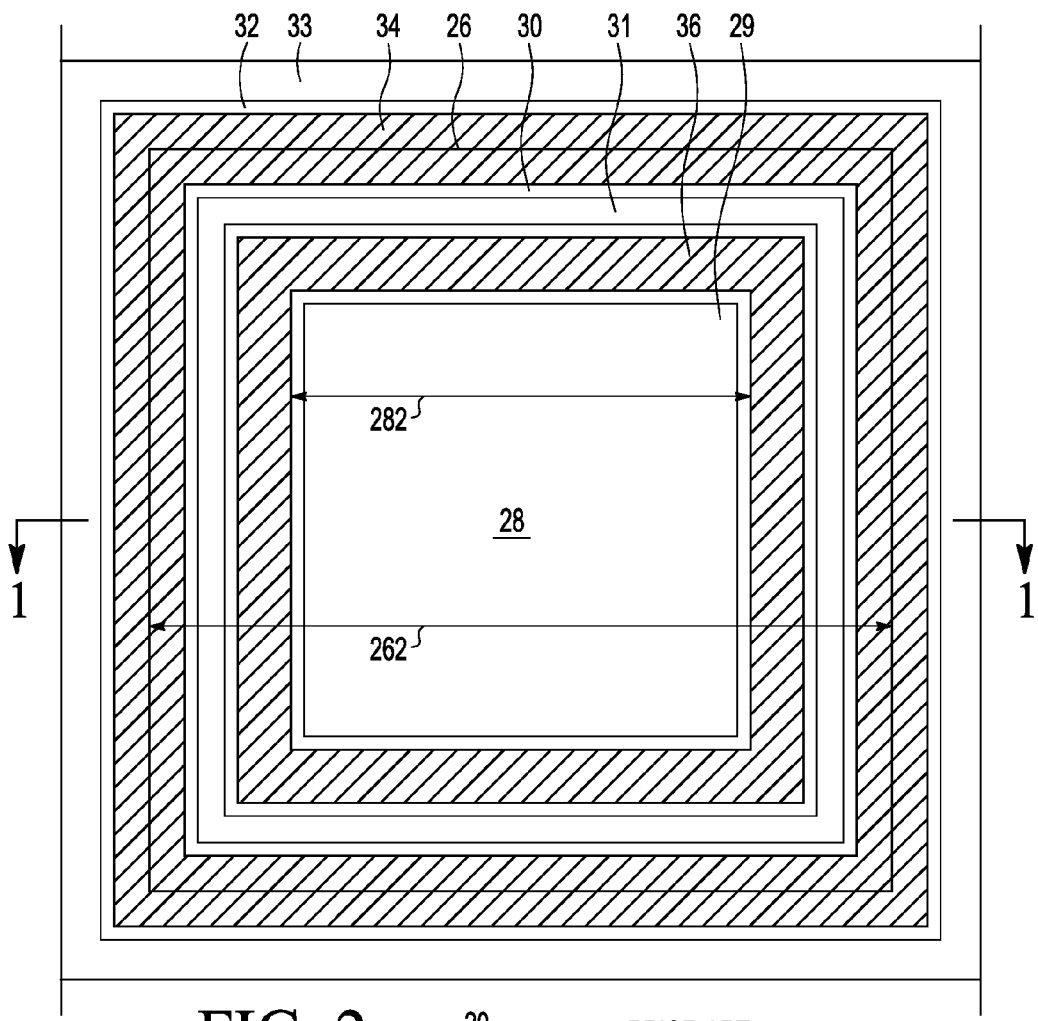
FIG. 2   20   - PRIOR ART -

HIGH GAIN TUNABLE BIPOLAR TRANSISTOR

FIELD OF THE INVENTION

The present invention generally relates to electronic devices and integrated circuits (ICs) and their methods of manufacture, and more particularly, structures and methods for forming bipolar transistors.

BACKGROUND OF THE INVENTION

Bipolar transistors are much used in modern electronic devices, especially integrated circuits (ICs). However, their performance is sometimes less than ideal, especially when they are being manufactured using a process optimized for other types of devices that may be the principal devices in the IC of which the bipolar transistor is to be a part. Metal-oxide-semiconductor field effect transistors (MOSFETs) and complementary metal-oxide-semiconductor (CMOS) field-effect-transistors (FETs) are non-limiting examples of such other devices widely used in ICs. However, the present invention is not limited merely to ICs made primarily using MOSFETs, CMOS devices and/or FETs but also applies to other device structures and associated manufacturing methods. Where bipolar transistors need to be included in the IC, they are often made using whatever process steps are available for making the device types that form the principal devices in the IC. In these circumstances, the properties of the bipolar transistors fabricated using unmodified manufacturing processes for such other device types are often less than ideal. While the properties of the included bipolar transistors might be improved by modifying and/or adding to the available process steps this will generally increase the overall cost of manufacture of the whole IC, which is very undesirable. Accordingly, a need continues to exist for providing improved bipolar devices adapted to be included in ICs with other types of devices without significantly modifying the underlying IC manufacturing process.

BRIEF DESCRIPTION OF THE DRAWINGS

The present invention will hereinafter be described in conjunction with the following drawing figures, wherein like numerals denote like or analogous elements, and wherein:

FIG. 1 is a simplified cross-sectional view and FIG. 2 is a simplified plan view of a prior art bipolar transistor, formed using an available CMOS IC manufacturing process;

DETAILED DESCRIPTION OF THE INVENTION

Figure 3:
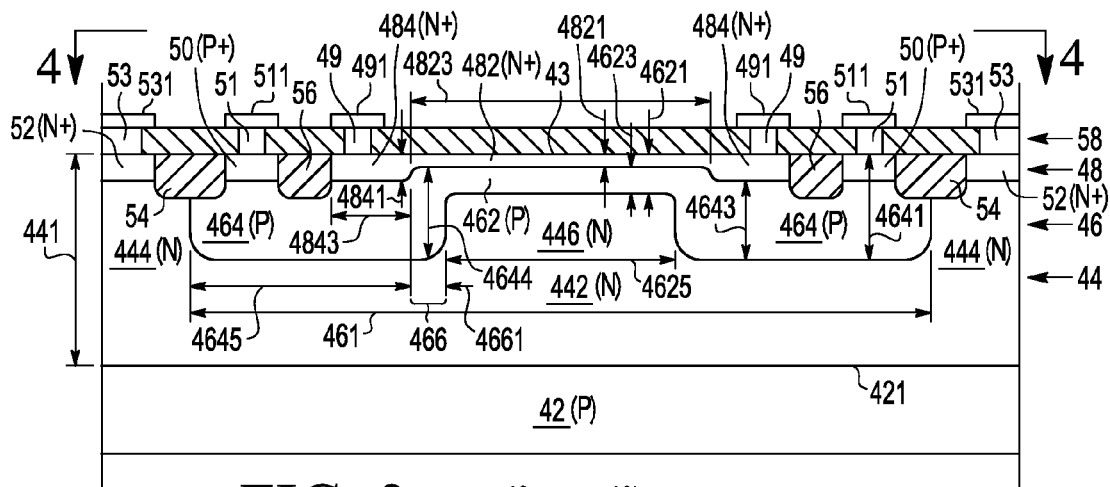
FIG. 3 is a simplified cross-sectional view and FIG. 4 is a simplified plan view of an improved bipolar transistor according to an embodiment of the present invention, formed using manufacturing process steps available within the manufacturing process by which the device of FIGS. 1-2 was formed, without adding or modifying any process steps.

The following detailed description is merely exemplary in nature and is not intended to limit the invention or the application and uses of the invention. Furthermore, there is no intention to be bound by any expressed or implied theory presented in the preceding technical field, background, or the following detailed description. For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions or layers in the figures may be exaggerated relative to other elements or regions or layers to help improve understanding of embodiments of the invention.

The terms "first," "second," "third," "fourth" and the like in the description and the claims, if any, may be used for distinguishing among similar elements or steps and not necessarily for describing a particular sequential or chronological order. It is to be understood that the terms so used are interchangeable under appropriate circumstances such that the embodiments of the invention described herein are, for example, capable of operation or fabrication in sequences other than those illustrated or otherwise described herein. Furthermore, the terms "comprise," "include," "have" and variations thereof, are intended to cover non-exclusive inclusions, such that a process, method, article, or apparatus that comprises a list of elements or steps is not necessarily limited to those elements or steps, but may include other elements or steps not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

As used herein, the term "semiconductor" is intended to include any semiconductor whether single crystal, poly-crystalline or amorphous and to include type IV semiconductors, non-type IV semiconductors, compound semiconductors as well as organic and inorganic semiconductors. Further, the terms "substrate" and "semiconductor substrate" are intended to include single crystal structures, polycrystalline structures, amorphous structures, thin film structures, layered structures as for example and not intended to be limiting, semiconductor-on-insulator (SOI) structures, and combinations thereof The term "semiconductor" is abbreviated as "SC." For convenience of explanation and not intended to be limiting, semiconductor devices and methods of fabrication may be described herein for silicon semiconductors but persons of skill in the art will understand that other semiconductor materials may also be used. Additionally, various device types and/or doped SC regions may be identified as being of N type or P type, but this is merely for convenience of description and not intended to be limiting, and such identification may be replaced by the more general description of being of a "first conductivity type" or a "second, opposite conductivity type" where the first type may be either N or P and the second type then is either P or N. As used herein, the terms metal-oxide-semiconductor (MOS), field effect transistor (FET), MOSFET and complementary MOS (CMOS) are intended to be interpreted broadly and include any type of dielectric (not just "oxide") and any type of conductor (not just "metal"). The term FET (singular or plural) is intended to include any type of field effect device and not be limited merely to those employing insulated gates. Similarly, the term "other device types" is intended to include any device type in addition to those specifically listed herein.

FIG. 1 is a simplified cross-sectional view and FIG. 2 is a simplified plan view of prior art bipolar transistor 20, formed using an available CMOS IC manufacturing process. Substrate 22 (e.g., P) includes collector region 24 (e.g., N), base region 26 (e.g., P) of depth 261, vertical base width 283 and lateral extent 262, emitter region 28 (e.g., N+) of depth 281 and lateral extent 282, base contact region 30 (e.g., P+) and collector contact region 32 (e.g., N+). Shallow trench isolation (STI) regions 34, 36 are provided extending into substrate 22 from upper surface 23. Contact electrode 33 with conductive interconnect 331 is provided in ohmic contact with collector contact region 32, contact electrode 31 with conductive interconnect 311 is provided in ohmic contact with base contact region 30, and electrode 29 with conductive interconnect 291 is provided in ohmic contact with emitter region 28. These various regions, layers, electrodes and contacts can be readily formed using almost any standard CMOS process. For example and not intended to be limiting, the various doped SC regions can be formed by using a combination of an N-well implant and a deep N-well implant to form collector region 24, a P-well implant to form base region 26, an N-source-drain (NSD) implant to form emitter 28 and collector contact 32, and a P-source-drain (PSD) implant to form base contact region 30. While ion implantation is generally a preferred means of doping SC substrate 22 to form such regions, other well known doping and/or epitaxial SC growth techniques may also be used.

It is often the case that the doping densities and depths of these various regions are optimized for formation of, for example, CMOS logic devices that make up the principal elements of the IC. For this reason, such doping densities and depths are not always well suited to forming bipolar transistors of desirable properties. The current gain (BETA) of bipolar transistor 20 may be much lower than is desired and/or other device properties may not be optimized for the desired bipolar device application. This is especially true when the CMOS devices are primarily small area digital logic devices and the bipolar transistor is primarily intended for use as an analog device. By way of example and not intended to be limiting, base 26 may be more heavily doped than is desired and base width 283 may be larger than is desired, resulting in excess carrier recombination in base 26 and very low current gain (BETA).

In order to avoid or minimize such problems, it has been the practice in the prior art to add to the IC manufacturing process, additional processing steps optimized for the formation of bipolar transistors, but which are otherwise usually not needed for the remainder of IC. However, this is not desirable since the manufacturing cost of the IC increases in proportion to the number of processing steps. Not only do the added process steps contribute directly to the added cost by adding time, material and tool use, but any yield losses associated with such added steps further increase the cost of the final product. The more process steps, the higher the total manufacturing cost of the IC. Accordingly, there is an ongoing need to be able to provide bipolar transistors in ICs, for example, otherwise dominated by logic or other device types, without increasing the cost of manufacture of the overall IC. More specifically, there is an ongoing need to be able to fabricate high performance bipolar transistors using available CMOS processes without adding further processes and/or process steps. It has been found that this can be accomplished by use of the structure illustrated in FIGS. 3-4 formed, for example, by the process steps depicted in FIGS. 5-12.

Figure 4:
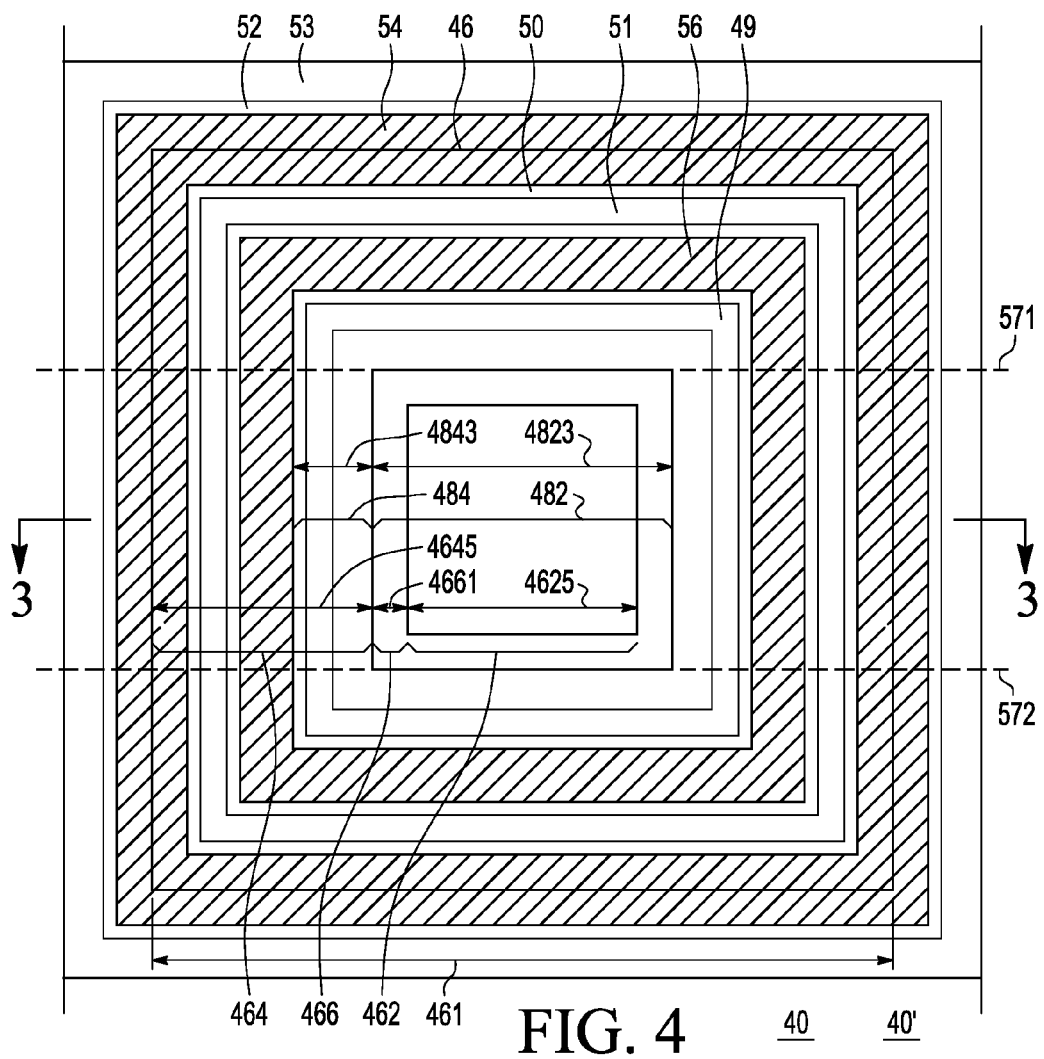

FIG. 3 is a simplified cross-sectional view and FIG. 4 is a simplified plan view of improved bipolar transistor 40, 40' according to embodiments of the present invention, formed using selected manufacturing process steps from those available within the CMOS IC manufacturing process by which the device of FIGS. 1-2 was formed, without modifying the available process steps or adding any further process steps. This judicious selection of available process steps and design of masks used with these process steps to form the various regions of the bipolar transistor(s) provide bipolar transistors of improved properties. Illustrative conductivity types and doping levels of various semiconductor regions are indicated in both the drawings and associated text, but this is merely for convenience of discussion and for illustrating a preferred embodiment and not intended to be limiting. Persons of skill in the art will understand that devices of opposite conductivity type may be constructed by interchanging the conductivity types of the various doped regions and that the doping levels of various regions may be modified using means well known in the art to suit the varied needs of device and IC designers.

Referring now to FIGS. 3-4, substrate 42 (e.g., P) has upper surface 43 and includes collector region 44 (e.g., N), base region 46 (e.g., P), emitter region 48 (e.g., N+), base contact region 50 (e.g., P+) and collector contact region 52 (e.g., N+). In a preferred embodiment, PN junction 421 exists between substrate 42 (e.g., P) and collector region 44 (e.g. N), but in other embodiments substrate 42 may be of the same conductivity type as collector region 44. Shallow trench isolation (STI) regions 54, 56 analogous to regions 34, 36 of FIGS. 1-2, are provided extending into substrate 42 from upper surface 43. Contact electrode 53 with conductive interconnection 531 is provided in ohmic contact with collector contact region 52, contact electrode 51 with conductive interconnection 511 is provided in ohmic contact with base contact region 50, and contact electrode 49 with conductive interconnection 491 is provided in ohmic contact with emitter region 48. Dielectric layer 58 is typically provided on substrate surface 43 between the various electrodes, to support the various interconnections and for surface passivation. Such dielectric layer(s) are well known.

Collector region 44 comprises buried layer 442 (e.g., N) underlying base region 46, peripheral portion 444 (e.g., N) laterally outboard of base region 46 for ohmically coupling buried layer 442 to collector contact region 52 (e.g., N+), and central portion 446 (e.g., N) extending upwardly between portions 464 (e.g., P) of base region 46 and in ohmic contact with underlying buried layer 442. Base region 46 comprises: (i) outer annular region 464 (e.g., P) of depth 4641 from surface 43, vertical base width 4643, overall outside lateral extent 461 and annular lateral extent 4645; (ii) central portion 462 (e.g., P) of depth 4621 from surface 43, vertical base width 4623 and lateral extent 4625, and (iii) annular transition zone 466 (e.g., P) partly of approximate depth 4641 from surface 43, laterally varying vertical base width 4644 and annular lateral extent 4661 lying between central portion 462 and peripheral portion 464 of base region 46. Overall lateral extent 461 of base region 46 is the sum of central lateral extent 4625 plus twice the value of annular lateral extents 4661 and 4645.

Emitter region 48 (e.g., N+) comprises central portion 482 of depth 4821 from surface 43 and lateral extent 4823, and annular peripheral portion 484 of depth 4841 from surface 43 and lateral annular extent 4843. Peripheral portion 484 lies laterally outboard of central portion 482 and in one of the embodiments shown in FIGS. 3-4 laterally surrounds central portion 482 (e.g., see FIG. 4). Depth 4841 of peripheral portion 484 of emitter 48 exceeds depth 4821 of central portion 482 of emitter 48. Lateral extent 4823 of central portion 482 of emitter 48 exceeds lateral extent 4625 of central region 446 of collector 44 and exceeds inner extent 4625 of central portion 462 of base region 46. Annular portion 466 of base region 46 lying outboard of central region 446 of collector 44 and laterally interior to annular base portion 464 is referred to as transition zone 466 of base region 46. Above central portion 446 of collector region 44, base width 4623 is substantially constant. Above portion 442 of collector region 44 in base portions 464, base width 4643 is also substantially constant and larger than base with 4623. In transition zone 466, vertical base width 4644 can vary as a function of lateral distance as the emitter depth changes from smaller value 4821 above central collector portion 446 and base portion 462 to larger value 4841 of annular emitter portion 484. Vertical base width 4644 in transition zone 466 can also vary because, while base region 46 extends to larger depth 4641 therein, emitter portion 482 still maintains smaller depth 4821 until emitter portion 484 is reached at the outer lateral edge of transition zone 466. Still further, vertical base width 4644 in transition zone 466 can also vary because of the curvature of base region 46 adjacent its boundary with central collector portion 446. Vertical base width 4623 of central base portion 462 is smaller than vertical base width 4644 of transition zone 466 and vertical base width 4643 of peripheral base portion 464. As vertical base width 4644 varies laterally, it can be smaller or larger than, or be comparable to vertical base width 4643. It has been found that the provisions of three base-width zones in laterally adjacent base portions 462, 466 and 464 can be utilized to obtain transistors 40, 40' of improved properties compared to transistor 20 of FIGS. 1-2. It has also been found that the properties of transistor 40, 40' can be advantageously tuned by varying width 4661 of transition zone 466. These properties are illustrated in more detail in connection with FIGS. 13-14. This combination of properties is a significant advance in the art.

While the embodiments of device 40 illustrated in FIGS. 3-4 are shown as having a generally annular construction in plan view and to be generally rectangular in plan view in the example of FIG. 4, this is merely for convenience of explanation and to depict a preferred embodiment, but is not intended to be limiting. In further embodiments, transistor 40 may still be annular in plan view shape but have other geometric configurations besides that illustrated in FIG. 4, as for example, and not intended to be limiting, circular, elliptical, polygonal, rectangular, and so forth. In still further embodiments, transistors 40' of improved properties may also be formed without annular configuration by replacing, for example and not intended to be limiting, those portions of the various doped regions lying above dashed line 571 and below line 572 in FIG. 4 by dielectric or other isolation regions, or various combinations of doped, dielectric and/or other isolation regions, while still having a central cross-section of transistor 40' analogous to that of FIG. 3. Such variations are also useful.

FIGS. 5-12 are simplified cross-sectional views through device 40, 40' of FIGS. 3-4 during various stages 105-112 of manufacture illustrating resulting structures 205-212, according to further embodiments of the invention and showing additional detail. For convenience of illustration and to avoid cluttering the drawings and obscuring the invention, the curvature of various doped and STI regions and the intersections of such regions, as were shown for example in FIG. 3, are simplified in FIGS. 5-12 to have rectangular shapes with generally right-angle corners and/or intersections. Persons of skill in the art will understand that such representation is schematic in nature and adequate for the purposes of illustrating the manufacturing process stages and not intended to represent the regions within devices 40, 40' in exact detail where such detail is not required for understanding by those of skill in the art of the manufacturing steps used to produce transistors 40, 40' of FIGS. 3-4.

Figure 5:
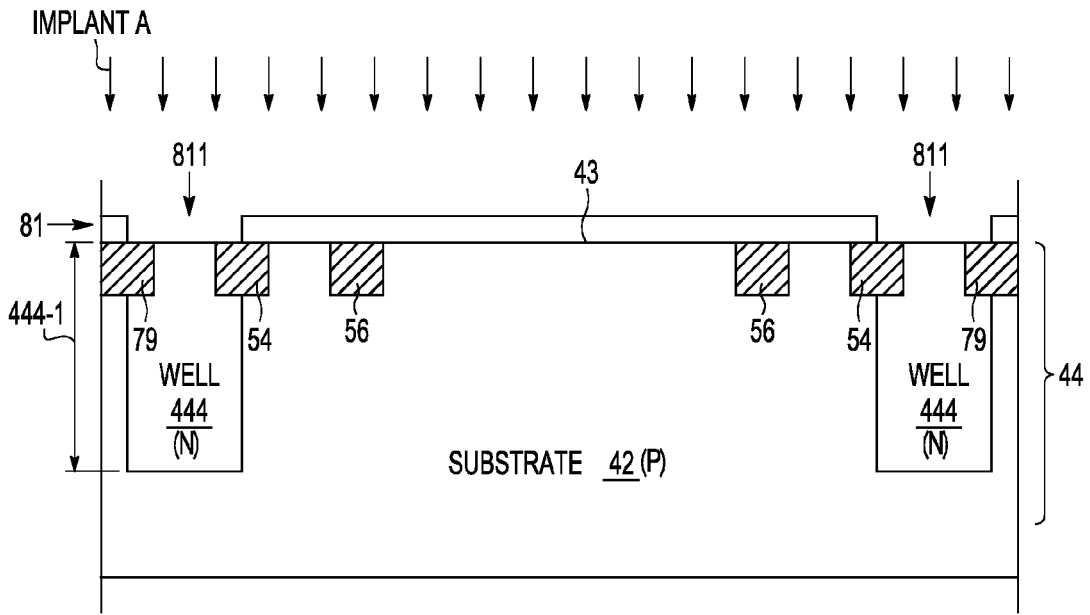
FIGS. 5-12 are simplified cross-sectional views through the device of FIGS. 3-4 during various stages of manufacture, according to further embodiments of the invention.
Figure 6:
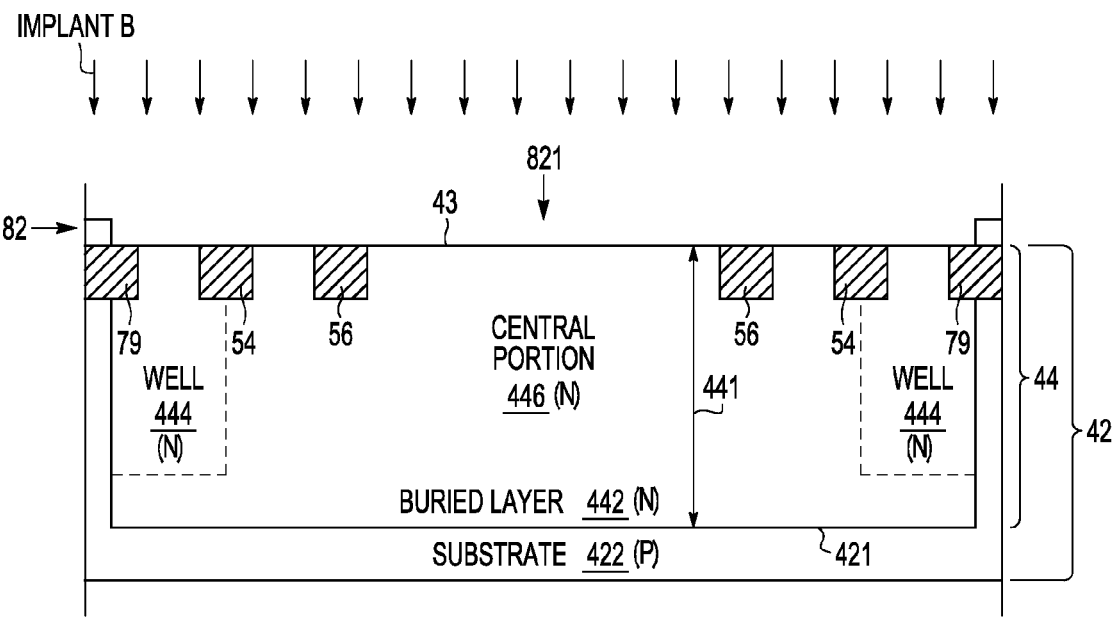

Manufacturing stage 105 of FIG. 5 and manufacturing stage 106 of FIG. 6 may be performed in either order. For convenience of explanation and not intended to be limiting, it is assumed that these manufacturing stages are performed in the order shown, but the opposite order may also be used. Referring now to manufacturing stage 105 of FIG. 5, substrate 42 (e.g., P) having upper surface 43 is provided, having a doping concentration usefully in the range of about 1E14 to 1E18 $cm^{-3}$, more conveniently about in the range of 3E14 to 1E17 $cm^{-3}$ and preferably in the range of about 5E14 to 5E15 $cm^{-3}$, but higher or lower doping levels may also be used depending upon the particular types of devices desired to be constructed therein. Conventional shallow trench isolation (STI) regions 56, 54, 79 have already been formed extending into substrate 42 from surface 43. Mask 81 having opening(s) 811 has been applied to surface 43. Unless otherwise specifically noted, photoresist is a suitable masking material for these and other doping steps where doping is intended to be carried out by ion implantation, which is the preferred doping method and common in the art. When other doping methods are used, then other well known masking materials, such as for example and not intended to be limiting, silicon oxide, silicon nitride and combinations thereof, may be employed. The present invention is not limited to doping merely by ion implantation and other well known techniques and combinations thereof may also be used. Implant screen oxides and the like may be employed on surface 43 but are omitted in FIG. 5 and following in order to avoid cluttering the drawings and obscuring the invention.

In manufacturing stage 105, Implant A is applied through opening(s) 811 in mask 81 to form WELL portions 444 (e.g., N) extending to depth 444-1 from surface 43 into substrate 42. Phosphorous, arsenic, antimony and/or combinations thereof are non-limiting examples of suitable dopants. Various doses ranging from about 1E12 to 4E14 $cm^{-2}$ are useful, with about 2E12 to 1E14 $cm^{-2}$ being more convenient and about 4.2E12 to 6.0E13 $cm^{-2}$ being preferred, and with energies in the range of about 60 KeV to 1.2 MeV being useful, about 90 KeV to 900 KeV being more convenient and about 135 KeV to 600 KeV being preferred. These are non-limiting examples of suitable doses and implant conditions and other values may also be used. The implant energy is desirably adjusted to determine depth 444-1 in connection with depth 441 of manufacturing stage 106 of FIG. 6, as will be subsequently explained. The purpose of well region(s) 444 is to provide a relatively low resistance path coupling collector buried layer 442 underlying base region 46 to collector contact region 52 (see FIG. 3). Accordingly, the doping of WELL portions 444 and depth 444-1 are desirably adjusted to suit that function. Doping concentration is usefully in the range of about 5E16 to 1E19 $cm^{-3}$, more conveniently about in the range of 1E17 to 5E18 $cm^{-3}$ and preferably in the range of about 5E17 to 2E18 $cm^{-3}$, but higher or lower doping levels may also be used. Structure 205 results.

Referring now to manufacturing stage 106 of FIG. 6, mask 81 of structure 205 is removed and mask 82 having opening 821 is applied over surface 43. Opening 821 desirably overlaps or encompasses WELL portions 444. Implant B is provided to form buried layer 442 (e.g., N) of depth 441 in ohmic contact with WELL portions 444 of depth 444-1 (see FIG. 5), and to form central portion 446 (e.g., N) extending substantially from buried layer 442 to surface 43. Accordingly, depth 444-1 of manufacturing stage 105 and depth 441 of manufacturing stage 106 are desirably adjusted to overlap. Dopant, implant energy and dose are desirably selected to substantially convert central region 446 from the original substrate type (e.g., P in this exemplary embodiment) to the opposite conductivity type (e.g., N), and provide buried layer 442 underlying central portion 446 and in ohmic contact with WELL portion(s) 444. In other embodiments, where PN junction 421 between substrate portion 422 and collector portion 442 is not needed (e.g., if substrate 42 is N type), then Implant B should be adjusted accordingly. For the structure illustrated in FIG. 6, phosphorous at a dose of about 5E13 cm$^{-2}$ and an energy of about 1000 KeV is an example of a suitable dopant and implant conditions for Implant B, but other dopants, doses and energies may also be used. This provides a peak doping concentration of about 1E18 cm$^{-3}$ at about 1.0-1.2 micrometers depth below surface 43, and for a substrate doping level of about 1E15 cm$^{-3}$ (e.g., P), converts a zone of about 2.2 to 2.5 micrometers depth below surface 43 from P to N type. However, other dopant levels and doping depths may be used to suit the purposes of the particular devices being designed and the underlying available process and substrate. Structure 206 results. As noted earlier, manufacturing stages 105 and 106 may be performed in either order.

Referring now to manufacturing stage 107, mask 82 of structure 206 is removed and replaced with mask 83 having opening(s) 831 and closed portions 832, 833. Closed portion 832 is desirably about centrally located between opening(s) 831 but other positions may also be used. Implant C is provided through mask opening(s) 831 to form WELL portions 464 (e.g., P) underlying STI region 56 and desirably also partly underlying STI region 54, on either side of central portion 446 (e.g., N). Boron or indium and/or combinations thereof are non-limiting examples of suitable dopants, but other dopants may also be used. Various doses ranging from about 1E11 to 5E14 cm$^{-2}$ are useful, with about 5E11 to 1E14 cm$^{-2}$ being more convenient and about 1E12 to 6E13 cm$^{-2}$ being preferred but larger or smaller doses may also be used. Energies in the range of about 5 KeV to 1 MeV are useful, about 10 KeV to 700 KeV are more convenient and about 15 KeV to 350 KeV are preferred and are non-limiting examples of suitable implant conditions, but larger or smaller implant energies may also be used. The implant energy is desirably adjusted so that the resulting doped region(s) extend substantially to depth 4641 leaving buried layer 442(N) of vertical thickness 445 underlying WELL regions 464(P). The purpose of WELL region(s) 464(P) is to provide portion(s) 464 (and 466) of base 46 of FIGS. 3-4 extending distance 4641 into substrate 42. Peak doping concentration is usefully in the range of about 5E16 to 1E19 cm$^{-3}$, more conveniently in the range of about 1E17 to 5E18 cm$^{-3}$ and preferably in the range of about 5E17 to 2E18 cm$^{-3}$, but higher or lower doping may be used. Depth 4641 is usefully in the range of about 0.4 to 5.0 micrometers, more conveniently in the range of about 0.5 to 4.0 micrometers and preferably in the range of about 0.6-3.0 micrometers, but larger or smaller depths may also be used. Thickness 445 of buried layer 442(N) is usefully in the range of about 0.1 to 2.0 micrometers, more conveniently in the range of about 0.2 to 1.5 micrometers and preferably in the range of about 0.3-1.0 micrometers, but larger or smaller depths may also be used. Structure 207 results.

Figure 8:
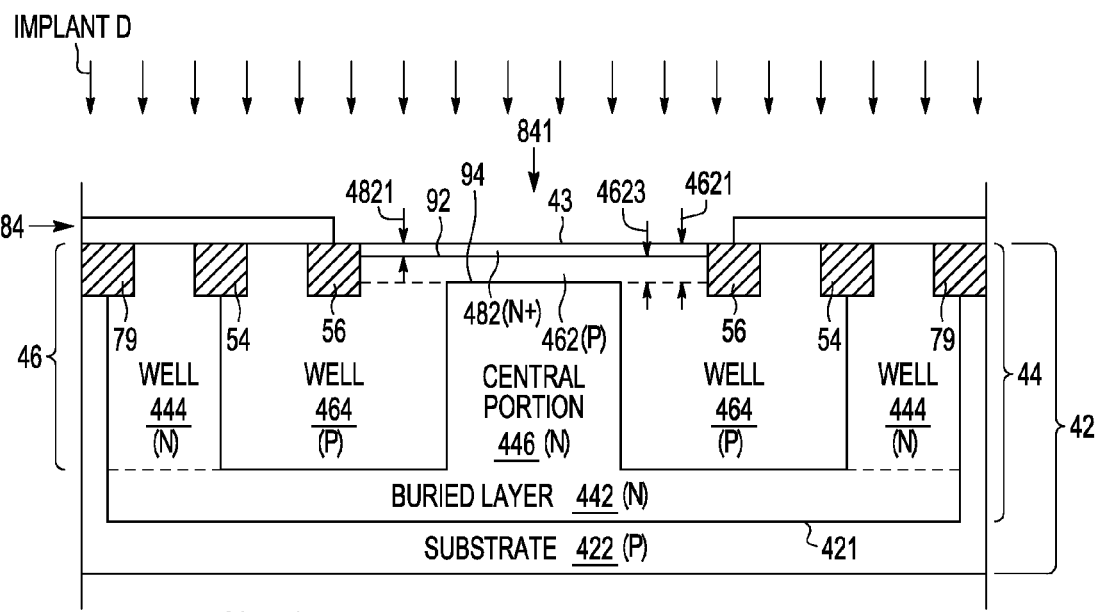

Referring now to manufacturing stage 108 of FIG. 8, mask 83 of structure 207 is removed and replaced with mask 84 having opening 841. Implant D is provided to form: (i) portion 482 (e.g., N+) of emitter 48, and (ii) to form portion 462 (e.g., P) of base 46, desirably extending laterally to or between STI region(s) 56 under mask opening 841. This is desirably accomplished by a chain implant through common mask opening 841, a first implant forming, for example, base portion 462 (e.g., P) of depth 4621 from surface 43 and a second implant forming, for example, emitter portion 482 (e.g., N) of depth 4821 from surface 43 less than depth 4621 so as to yield net vertical base width 4623, which doping steps can be performed in either order. Further, it is desirable that the net doping level of emitter portion 482 be higher than the net doping level of base portion 462. Boron and arsenic are examples of suitable dopants for forming portions 462 and 482, respectively, but other dopants can also be used. By way of example and not intended to be limiting, a boron dose of about 3E13 to 4E13 at an energy of about 9 KeV and an arsenic dose of about 6E14 to 7E14 at an energy of about 7 KeV are suitable, but other doses and energies may also be used. It is desirable that emitter portion 482 has a shallower depth 4821 than base portion 462 of depth 4621, so that net base width 4623 is obtained usefully in the range of about 0.05 to 0.6 micrometers, more conveniently in the range of about 0.075 to 0.4 micrometers and preferably about 0.1 to 0.2 micrometers. The peak doping of base portion 462 is usefully less than the peak doping of emitter portion 482 by a factor in the range of about 1 to $10^3$, more conveniently in the range of about 5 to 500 and preferably in the range of about $10^1$ to $10^2$, but larger or smaller ratios can also be used. Structure 208 results.

Figure 7:
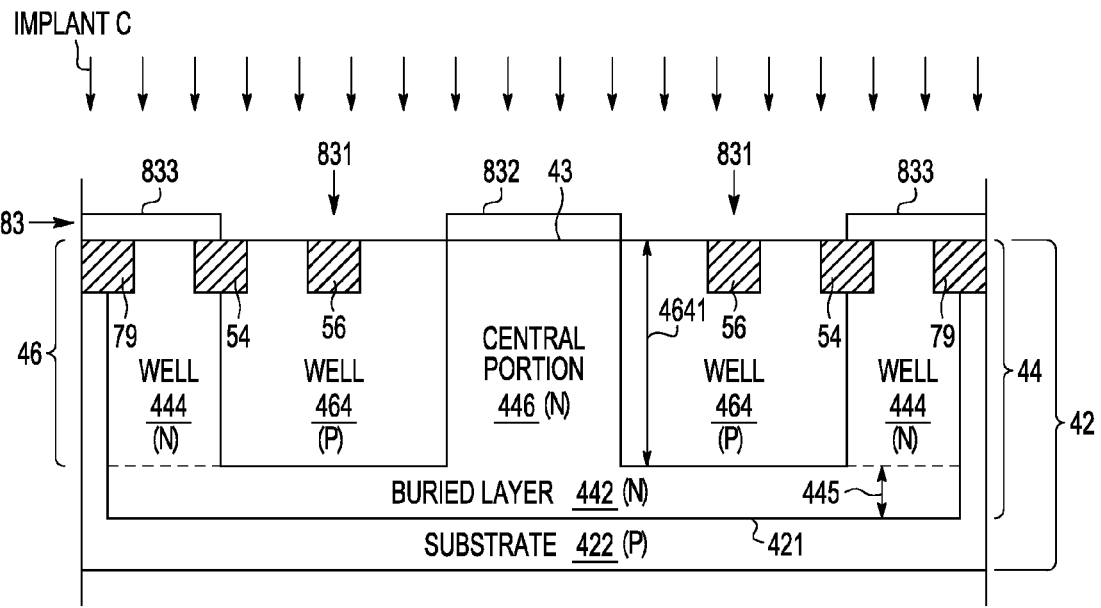
Figure 9:
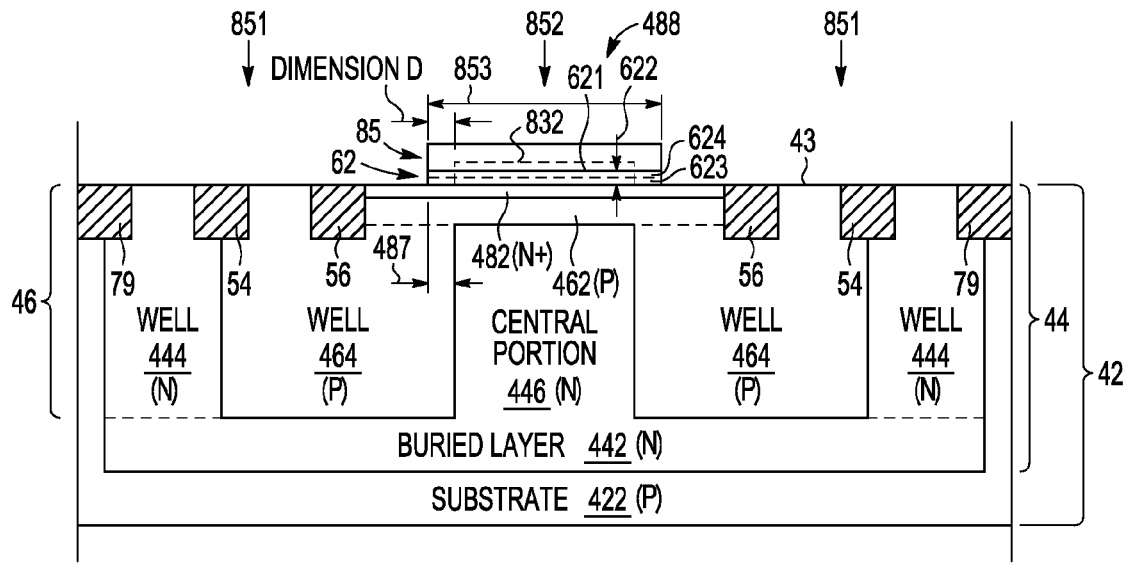

Referring now to manufacturing stage 109 of FIG. 9, mask 84 of manufacturing stage 108 is removed and dielectric layer 62 of thickness 622 and mask 85 applied over surface 43. Dielectric layer 62 is desirably a double layer having first layer or portion 623 on surface 43 and overlying layer or portion 624. First layer or portion 623 is desirably formed of silicon oxide. Chemical vapor deposition (CVD) using tetra-ethyl-ortho-silicate (TEOS) to produce first layer or portion 623 of about 15 nanometers thickness is an example of a suitable material, thickness and formation technique, but other dielectric materials, thicknesses and formation techniques may also be used. Second layer or portion 624 is conveniently formed by CVD of silicon nitride of about 95 nanometers thickness, but other dielectric materials, thicknesses and formation techniques may also be used. A primary purpose of layer 62 of thickness 622 is to act as a self-aligned implant mask during a subsequent fabrication stage (e.g., see stage 111 of FIG. 11). Mask 85 of, for example, photoresist, is provided over dielectric layer 62. Mask 85 has opening(s) 851 and closed portion 852 of lateral extent 853 generally located over central region 488 above central collector portion 446. It is desirable that closed portion 852 of width 853 extend laterally beyond the location of central portion 832 of mask 83 of FIG. 7 by Dimension D and laterally beyond central portion 446 of collector region 44 by distance or dimension 487. (It will be recalled that central portion 832 of mask 83 of manufacturing stage 107 of FIG. 7 was used to determine the location and width of central portion 446(N) of collector region 44.) Central portion 832 of mask 83 of FIG. 7 is shown in dashed outline in FIG. 9 for convenience in identifying Dimension D. While Dimension D and lateral extent 487 are generally close in size, persons of skill in the art will understand that lateral extent 487 is usually slightly larger than Dimension D due to thermal diffusion and lateral straggle of Implant C of FIG. 7. It will also be apparent to those of skill in the art that lateral extent 487 (and also Dimension D) are closely related to desired width 4661 of transition zone 466 of FIGS. 11 and 3. As will become apparent in connection with manufacturing stage 111 of FIG. 11, the size and location of closed mask portion 852 of FIG. 9 can be used to substantially control width 4661 of transition zone 466 (see FIGS. 11 and 3). In manufacturing stage 109, closed portion 852 of mask 85 is used to protect portion 621 of dielectric layer 62 over central region 488 so that the remainder of dielectric layer 62 can be removed by, for example, plasma or wet chemical etching using conventional reagents. As will be subsequently explained (e.g., see FIG. 11) thickness 622 is important in combination with Implant F of manufacturing stage 111 in maintaining or controlling final depth 4821 of emitter portion 482 formed initially in a preferred embodiment by Implant D. Structure 209 results from manufacturing stage 109. Dimension D identified in FIG. 9 is conveniently used as the variable on the abscissa of FIG. 14 since it can be easily determined from the dimensions and locations of the masks being used in manufacturing stages 107 and 109, and is closely related to and a suitable surrogate for dimensions or lateral extents 487 and 4661 of FIGS. 9, 11 and 3.

Figure 10:
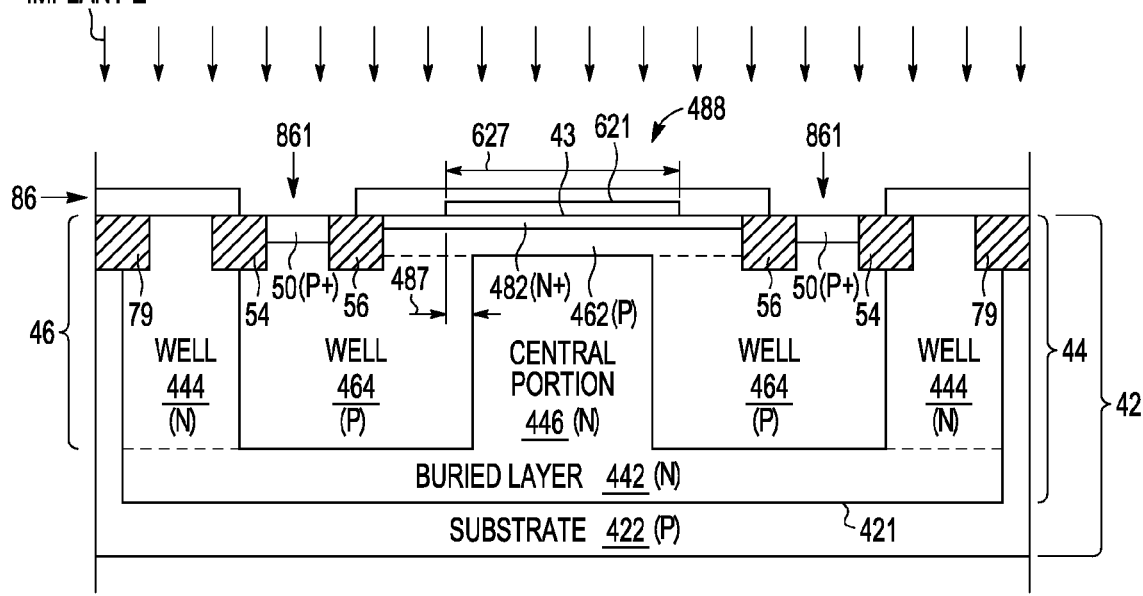

In manufacturing stage 110 of FIG. 10, mask portion 852 of structure 209 is removed and mask 86 having opening(s) 861 provided over surface 43 and dielectric region 621. Implant E is then provided to form doped contact regions 50 (e.g., P+) making ohmic contact to WELL portions 464(P) of base 46. A source-drain implant (e.g., P+) of the available CMOS process is suitable for forming contact region(s) 50. By way of example and not intended to be limiting, a boron dose of about 3.5E15 cm$^{-2}$ at an energy of about 5 KeV is suitable, providing contact region 50 with a peak dopant concentration at or above about 1E20 cm$^{-3}$. Structure 210 results.

Figure 11:
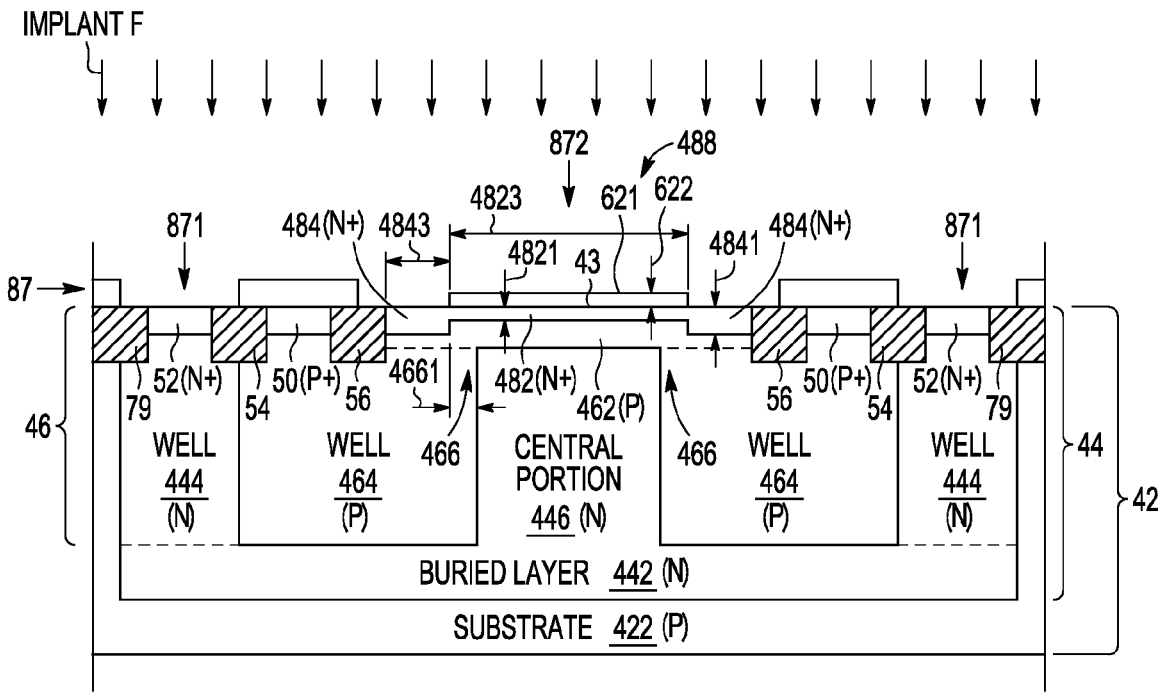

Referring now to manufacturing stage 111 of FIG. 11, mask 86 of manufacturing stage 110 is removed and replaced by mask 87 having openings 871, 872. Implant F provides a highly doped region of conductivity type (e.g., N+) suitable for portion(s) 484 (e.g., N+) of emitter 48 and collector contact region(s) 52 (e.g., N+). A source-drain (e.g., N+) implant of the available CMOS process is useful for such purposes. By way of example and not intended to be limiting, an arsenic dose of about 3.0E15 cm$^{-2}$ at an energy of about 30 KeV and/or a phosphorous dose of about 1.0E14 cm$^{-2}$ at an energy of about 30 KeV or a combination thereof is suitable. Implant F provides (e.g., annular shaped) emitter portion(s) 484 (e.g., N+) and collector contact region(s) 52 (e.g., N+) with a peak dopant concentration at or above about 1E20 cm$^{-3}$ and depth 4841 from SC surface 43. In a preferred embodiment, thickness 622 of dielectric region 621 formed in manufacturing stage 109 is chosen so as to substantially block implant F in central portion 488 underlying dielectric region 621. In this way, thickness 4821 of central portion 482 of emitter 48 in the shadow of dielectric region 621 remains substantially unchanged (other than whatever dopant movement may result from intervening thermal cycles) from that established by Implant D of manufacturing stage 108. In further embodiments, dielectric region 621 may be made thicker or thinner and/or the energy of Implant F changed so that depth 4821 of emitter portion 482 is not finalized until manufacturing stage 111 of FIG. 11. Alternatively, in still further embodiments, a further portion of mask 87 may be provided over or in place of dielectric region 621 (e.g., with manufacturing stage 109 being omitted) so as to shadow emitter portion 482 while the doping of emitter portion 484 and collector contact region 52 is carried out. Either arrangement is useful. Structure 211 results, in which the various doped regions of transistor 40, 40' have now been substantially provided. In considering manufacturing stages 109-111, it will be understood that width 853 of closed portion 852 of mask 85 determines overlap extent 487 and Dimension D of FIG. 9, which in turn substantially determines width 627 of dielectric region 621 and overlap extent 487 in FIG. 10, which in turn substantially determines outer lateral width 4823 and annular lateral extent 4661 of transition zone 466 of FIGS. 11 and 3. Manufacturing stages 110 and 111 may be performed in either order.

Figure 12:
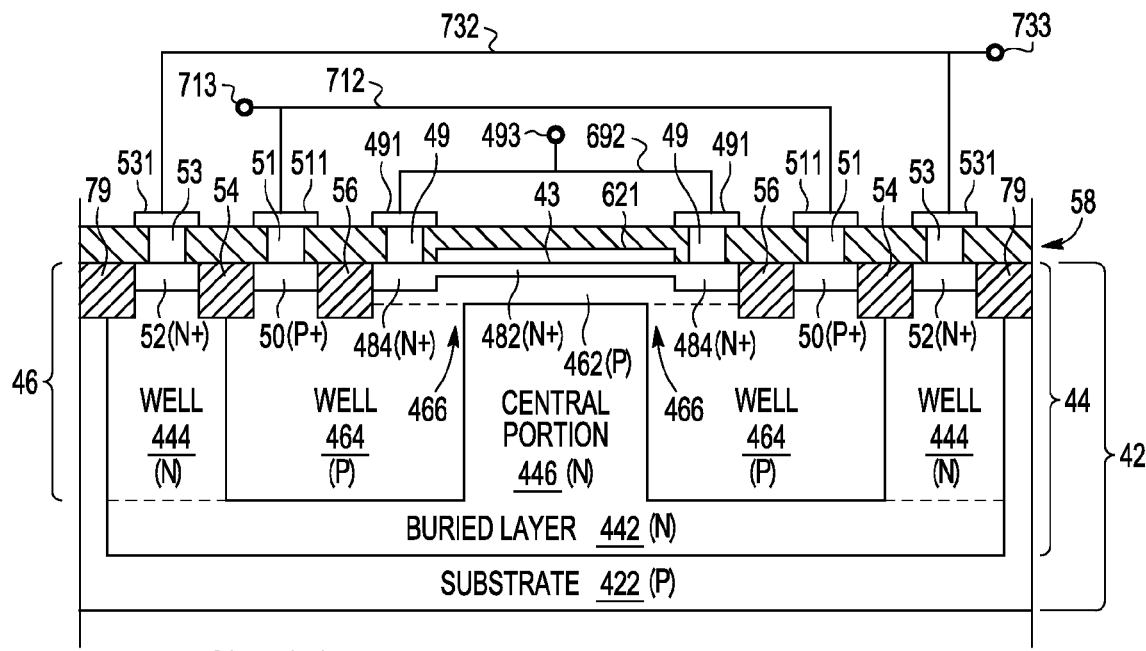

Referring now to manufacturing stage 112 of FIG. 12, mask 87 is removed and the various dielectric layers and conductor contacts and interconnects illustrated in FIGS. 3-4 and 12 are provided using means well known in the art. For example, dielectric layer 58 is provided on surface 43, conductor contacts 53, 51, 49 are provided making ohmic contact to doped SC regions 52, 50, 48 respectively, and interconnection 531, 511, 491 and 732, 712, 692 provided so that emitter region 48 is coupled to emitter terminal 493, base region 46 is coupled to base terminal 713 and collector region 44 is coupled to collector terminal 733. Lead 692 indicates that portion of emitter interconnect 491 coupled to emitter terminal 493 that is out of the plane of the drawing of FIG. 12, lead 712 indicates that portion of base interconnect 511 coupled to base terminal 713 that is out of the plane of the drawing of FIG. 12 and lead 732 indicates that portion of collector interconnect 531 coupled to collector terminal 733 that is out of the plane of the drawing of FIG. 12. Dielectric region 621 is shown in FIG. 12 but not separately identified within dielectric layer 58 in FIG. 3 since it may be removed prior to providing dielectric layer 58 or may be omitted and replaced by a temporary mask as noted earlier. Either arrangement is useful. Device 40, 40' of FIGS. 3-4 and 12 is substantially finished. It will be understood by those of skill in the art based on the description herein that whatever other devices (e.g., for logic circuits) are provided on substrate 42, e.g., as part of the same integrated circuit (IC), that bipolar transistor 40, 40' has been formed at the same time as such logic devices and using the available logic device process steps, without any need to add further process or modify the existing process steps in order to obtain bipolar transistor(s) 40, 40' of improved properties. This is an extremely useful result, obtaining ICs comprising higher performance bipolar transistors without an increase in IC manufacturing cost, and is a significant advance in the art.

Figure 13:
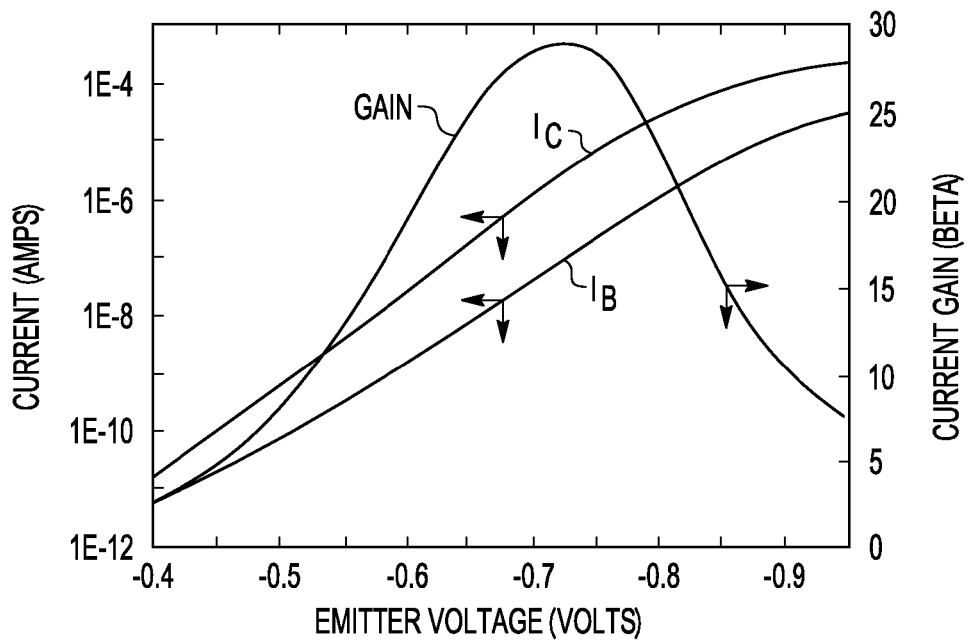
FIG. 13 is a simplified plot of collector current, base current and current gain (BETA) versus emitter voltage for the device of FIGS. 3-12.

FIG. 13 shows simplified plot 90 of simulated collector current $I_C$, base current $I_B$ and current gain (BETA) versus emitter voltage for CMOS process bipolar transistor 40, 40' of FIGS. 3-12. It will be noted that peak current gain for transistor 40, 40' is about 29 as compared to a peak current gain of about 2.7 for conventional CMOS process bipolar transistor 20 of FIGS. 1-2. This is a very significant improvement in transistor gain. Simulations show that a large amount of electrons are injected from the contoured emitter-base junction between central portion 482 and annular peripheral portion 484 of emitter 48 into and through base transition zone 466. The data of FIG. 13 corresponds to Dimension D of about 0.1 micrometers. The injected electrons are collected by collector central portion 446 when lateral extent 4661 of base transition zone 466 is sufficiently small. By way of example and not intended to be limiting, lateral extent 4661 is usefully of less than or equal about 10 micrometers, conveniently less than or equal about 5 micrometers, more conveniently less than or equal about 2 micrometers and preferably less than or equal about 0.3 micrometers (e.g., see FIG. 14), but other values may be also used. Electron conduction from emitter central portion 482 into collector central portion 446 also plays an important role in the total current flow. This is because vertical base width 4623 of base central portion 462 is small (e.g., less than or equal about 0.15 micrometers). On the other hand, vertical base width 4643 of base annular peripheral portion 464 is relatively large (e.g., at least about 0.7 micrometers) and the base doping concentration in base annular peripheral portion 464 is relatively high compared to transition region 466. Consequently, only a relatively small portion of electrons flow from emitter peripheral portion 484 to collector buried layer region 442 through base peripheral portion 464.

The existence of high current conduction paths in transition region 466 of bipolar transistor 40, 40' of FIGS. 3-12 provides a significant improvement in the current gain. Other portions of the device also contribute.

Figure 14:
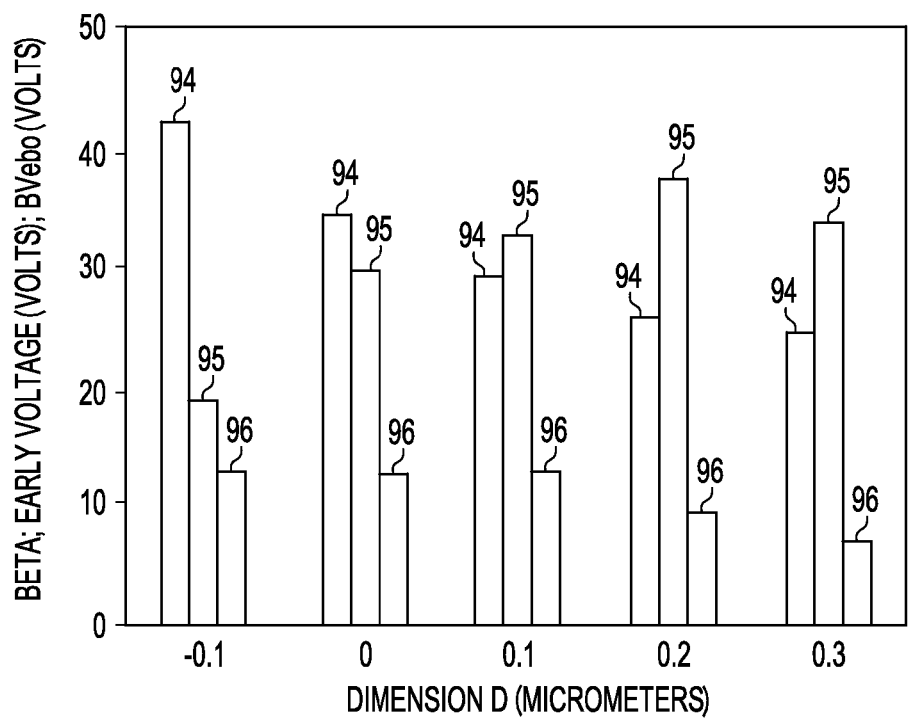
FIG. 14 is a simplified bar chart showing how the current gain, Early Voltage and breakdown voltage BVebo vary as a function of Dimension D defined in FIG. 9, for the device of FIGS. 3-12.

FIG. 14 presents simplified bar chart 92 showing how the current gain (BETA), Early Voltage and breakdown voltage BVebo vary as a function of lateral Dimension D in FIG. 9. Current gain (BETA) is shown by the bars identified by reference number 94. Early Voltage is shown by the bars identified by reference number 95 and BVebo is shown by the bars identified by reference number 96. It will be noted that by using different values of Dimension D, that different combination of these important transistor properties may be obtained, depending upon the needs of the particular IC being designed. For example, to obtain a higher current gain, a smaller lateral Dimension D is desirable. This is because electron conduction via base transition zone 466 becomes more and more significant as lateral Dimension D becomes smaller. In another embodiment, breakdown voltage BVebo can be improved without significantly compromising other device characteristic by choosing other values for Dimension D. Simulations show that, when Dimension D is sufficiently small, base portion 462 and transition zone 466 are substantially depleted before the transistor junction breaks down. In this case, BVebo takes place between the emitter-base junction in peripheral region 484 and 464, which gives rise to a high BVebo. In yet another embodiment, when a high Early Voltage is desirable, a larger value of Dimension D is preferred because the Early voltage starts to drop rapidly when Dimension D becomes too small. In addition to Dimension D, the relative areas or lateral sizes of the central region, transition region, and peripheral region of the emitter-base junction is another useful parameter for adjusting the characteristic of bipolar transistor 40, 40'. For example, a larger area or lateral size central region 482 and 462 or a smaller area or lateral size peripheral region 484 and 464 will provide a higher peak current gain at the expense of the Early Voltage. The breakdown voltage is found to be relatively insensitive to the area or lateral size of the central and peripheral regions. Persons of skill in the art will understand based on the description herein how to obtain a desired combination of device characteristic for bipolar transistor 40, 40' by choosing Dimension D and the relative areas or lateral sizes of central region 482, 462, and peripheral region 484, 464. This ability to tailor the bipolar transistor properties to suit the needs of individual IC applications is very useful and a significant advance in the art. This is especially true because such change does not require any modifications of the manufacturing process for forming the IC, but is accomplished by one or more simple mask changes and selection of pre-existing process steps, as for example and not intended to be limiting, by the varying width 853 of mask portion 852 in manufacturing stage 109 which changes Dimension D and therefore lateral extent 4661. Other means of varying lateral extent 4661 may also be used.

According to a first embodiment, there is provided a bipolar transistor (40, 40'), comprising, an emitter region (48) having a first emitter portion (482) of a first emitter thickness (4821) and a second emitter portion (484) of a second emitter thickness (4841), located laterally outboard of the first emitter portion (482), wherein the second emitter thickness (4841) exceeds the first emitter thickness (4821), a base region (46) having portions (462, 466, 464) of varying base widths (4623, 4644, 4643) underlying the emitter region, and a collector region (44) having a portion (442) underlying the base region. According to a further embodiment, the base region comprises a first base portion (462) of first base portion width (4623), a second base portion (466) of second base portion width (4644) and a third base portion (464) of third base portion width (4643), the first base portion (462) and the second base portion (466) substantially underlying the first emitter portion (482). According to a still further embodiment, at least a part of the third base portion (464) substantially underlies the second emitter portion (484). According to a yet further embodiment, the second base portion width (4644) exceeds the first base portion width (4623). According to a still yet further embodiment, the third base portion width (4643) exceeds the first base portion width (4623). According to a yet still further embodiment, the second base portion width (4644) is equal, smaller or larger than the third base portion width (4643). According to another embodiment, the second base portion (466) is less heavily doped than the third base portion (464). According to a still another embodiment, the second base portion (466) has a lateral width (4661) less than or equal about 10 micrometers. According to a yet another embodiment, the first base portion width (4623) is in the range of about 0.05 to 0.6 micrometers.

According to a second embodiment, there is provided a method for forming a bipolar transistor (40, 40'), comprising, providing (105) a semiconductor substrate (42) having a first surface (43), then in any order, forming (105, 106) in the semiconductor substrate (42) a collector (44) having a first region (442) underlying and separated from the first surface (43) and a second region (446) extending from the first region (442) toward the first surface (43), forming (107, 108) in the substrate a base (46) having a first region (462) of a first base depth (4621) from the first surface (43) and a second region (464) of a second base depth (4641) from the first surface (43) larger than the first base depth (4621), and forming (108-111) in the substrate (42) an emitter (48) having a first emitter region (482) of a first emitter depth (4821) from the first surface (43) and a second emitter region (484) of a second emitter depth (4841) from the first surface (43) larger than the first emitter depth (4821). According to another embodiment, the emitter (48) is formed in two steps, wherein the first emitter region (482) of the first emitter depth (4821) is formed in a first emitter doping step (108) and the second emitter region (484) of the second emitter depth (4841) is formed in a second emitter doping step (111). According to still another embodiment, the base (46) is formed in two steps, wherein the second base region (464) is formed in a first base doping step (107) and the first base region (462) is formed in a second base doping step (108). According to yet another embodiment, the emitter (48) is formed in two steps, wherein the first emitter region (482) of the first emitter depth (4821) is formed in a first emitter doping step (108) and the second emitter region (484) of the second emitter depth (4841) is formed in a second emitter doping step (111), the base (46) is formed in two steps, wherein the second base region (464) is formed in a first base doping step (107) and the first base region (462) is formed in a second base doping step (108), and the first emitter region (482) and the first base region (462) are formed in a chain implant doping step (108). According to still yet another embodiment, the method further comprises forming (107-111) a transitional third base region (466) of lateral extent (4661) and variable vertical base depth (4644) located laterally between the first base region (462) and the second base region (464). According to a yet still another embodiment, the transitional third base transition region (466) substantially underlies part of the first emitter region (482). According to an additional embodiment, the lateral extent (4661) of the transitional third base region (466) is determined in part by a dopant mask (621) provided after the step (108) of forming the first emitter region (482).

According to a third embodiment, there is provided a bipolar transistor (40, 40'), comprising, an emitter region (48) comprising a first emitter portion (482) of a first thickness (4821) and a second emitter portion (484) of a second (4841) thickness larger than the first thickness (4821), a base region (46) comprising a first base portion (462) of a first base width (4623) and a first lateral extent (4625), a second base portion (464) of a second base width (4643) different than the first base width (4623) and having a second lateral extent (4645), and a third base portion (466) lying laterally between the first base portion (462) and the second base portion (464) and having a third base width (4644) and a third lateral extent (4661) wherein the third base width (4644) is larger than the first base width (4623), and a collector region (44) comprising a buried layer region (442) underlying the base region (46) and a second collector portion extending from the buried layer region (442) to a collector contact region (52) and a third collector region (446) region lying above the buried layer region (442) and underlying the first base portion (462) of the base region (46). According to a further embodiment, the third lateral extent (4661) is less than or equal about 10 micrometers. According to a still further embodiment, the third base width (4644) is equal, smaller or larger than the second base width (4643). According to a yet further embodiment, the second base portion (464) substantially laterally surrounds the first base portion (462) and the third base portion (466).

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements and order of process steps described in connection with an exemplary embodiment without departing from the scope of the invention as set forth in the appended claims and their legal equivalents.

What is claimed is:

1. A bipolar transistor, comprising:
   an emitter region having a first emitter portion of a first emitter thickness and a second emitter portion of a second emitter thickness, located laterally outboard of the first emitter portion, wherein the second emitter thickness exceeds the first emitter thickness;
   a base region having portions of varying lateral base widths underlying the emitter region, wherein a lateral base width is a dimension perpendicular to an upper surface of the bipolar transistor; and
   a collector region having a portion underlying the base region.

2. The device of claim 1, wherein the base region comprises a first base portion of first base portion width, a second base portion of second base portion width and a third base portion of third base portion width, the first base portion and the second base portion substantially underlying the first emitter portion.

3. The device of claim 2, wherein at least a part of the third base portion substantially underlies the second emitter portion.

4. The device of claim 2, wherein the second base portion width exceeds the first base portion width.

5. The device of claim 2, wherein the third base portion width exceeds the first base portion width.

6. The device of claim 2, wherein the second base portion width is equal, smaller or larger than the third base portion width.

7. The device of claim 2, wherein a part of the second base portion is less heavily doped than the third base portion.

8. The device of claim 2, wherein the second base portion has a lateral width less than or equal about 10 micrometers.

9. The device of claim 2, wherein the first base portion width is in the range of about 0.05 to 0.6 micrometers.

10. A bipolar transistor, comprising:
    an emitter region comprising a first emitter portion of a first thickness and a second emitter portion of a second thickness larger than the first thickness;
    a base region comprising a first base portion of a first base width and a first lateral extent, a second base portion of a second base width different than the first base width and having a second lateral extent, and a third base portion lying laterally between the first base portion and the second base portion and having a third base width and a third lateral extent wherein the third base width is larger than the first base width; and
    a collector region comprising a buried layer region underlying the base region and a second collector portion extending from the buried layer region to a collector contact region and a third collector region lying above the buried layer region and underlying the first base portion of the base region.

11. The bipolar transistor of claim 10, wherein the third lateral extent is less than or equal about 10 micrometers.

12. The bipolar transistor of claim 10, wherein the third base width is equal, smaller or larger than the second base width.

13. The bipolar transistor of claim 10, wherein the second base portion substantially laterally surrounds the first base portion and the third base portion.

14. A bipolar transistor, comprising:
    a semiconductor substrate having a first surface;
    a collector formed in the semiconductor substrate and having a first region underlying and separated from the first surface and a second region extending from the first region toward the first surface;
    a base formed in the semiconductor substrate and having a first region of a first base depth from the first surface and a second region of a second base depth from the first surface larger than the first base depth; and
    an emitter formed in the semiconductor substrate and having a first emitter region of a first emitter depth from the first surface and a second emitter region of a second emitter depth from the first surface larger than the first emitter depth.

15. The bipolar transistor of claim 14, further comprising forming a transitional third base region of lateral extent and variable vertical base depth located laterally between the first base region and the second base region.

16. The bipolar transistor of claim 15, wherein the transitional third base transition region substantially underlies part of the first emitter region.

\* \* \* \* \*